US009890254B2

United States Patent
Kondo et al.

(10) Patent No.: US 9,890,254 B2
(45) Date of Patent: *Feb. 13, 2018

(54) RESIN COMPOSITION, RESIN FILM, AND SEMICONDUCTOR DEVICE AND METHOD FOR MANUFACTURING SAME

(71) Applicant: SHIN-ETSU CHEMICAL CO., LTD., Tokyo (JP)

(72) Inventors: Kazunori Kondo, Annaka (JP); Yoichiro Ichioka, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 19 days.

This patent is subject to a terminal disclaimer.

(21) Appl. No.: 15/113,556

(22) PCT Filed: Jan. 7, 2015

(86) PCT No.: PCT/JP2015/050203
§ 371 (c)(1),
(2) Date: Jul. 22, 2016

(87) PCT Pub. No.: WO2015/111427
PCT Pub. Date: Jul. 30, 2015

(65) Prior Publication Data
US 2017/0009022 A1    Jan. 12, 2017

(30) Foreign Application Priority Data
Jan. 23, 2014 (JP) .................. 2014-010332

(51) Int. Cl.
| | |
|---|---|
| C08L 63/00 | (2006.01) |
| C08G 77/48 | (2006.01) |
| C08G 77/52 | (2006.01) |
| C08G 59/32 | (2006.01) |
| C08K 3/36 | (2006.01) |
| H01L 23/29 | (2006.01) |
| C09D 163/00 | (2006.01) |
| C08L 83/14 | (2006.01) |
| C09D 183/14 | (2006.01) |
| H01L 21/56 | (2006.01) |
| H01L 21/78 | (2006.01) |
| C08G 59/30 | (2006.01) |

(52) U.S. Cl.
CPC ........... *C08G 77/48* (2013.01); *C08G 59/306* (2013.01); *C08G 59/32* (2013.01); *C08G 77/52* (2013.01); *C08K 3/36* (2013.01); *C08L 63/00* (2013.01); *C08L 83/14* (2013.01); *C09D 163/00* (2013.01); *C09D 183/14* (2013.01); *H01L 21/561* (2013.01); *H01L 21/563* (2013.01); *H01L 21/78* (2013.01); *H01L 23/295* (2013.01); *H01L 23/296* (2013.01); *H01L 2924/0002* (2013.01)

(58) Field of Classification Search
CPC .................. C08L 63/00; C08L 83/14
See application file for complete search history.

(56) References Cited

U.S. PATENT DOCUMENTS

| | | | |
|---|---|---|---|
| 2011/0105646 A1 | 5/2011 | Kan et al. | |
| 2012/0108762 A1* | 5/2012 | Kondo | C08G 77/14 525/476 |
| 2012/0213993 A1 | 8/2012 | Takeda et al. | |

FOREIGN PATENT DOCUMENTS

| | | |
|---|---|---|
| JP | 2009-132828 A | 6/2009 |
| JP | 2010-50346 A | 3/2010 |
| JP | 2012-92268 A | 5/2012 |
| JP | 2012-188650 A | 10/2012 |

(Continued)

OTHER PUBLICATIONS

International Search Report for PCT/JP2015/050203 (PCT/ISA/210) dated Mar. 31, 2015.

(Continued)

*Primary Examiner* — Margaret G Moore
(74) *Attorney, Agent, or Firm* — Birch, Stewart, Kolasch & Birch, LLP

(57) ABSTRACT

The present invention relates to a resin composition containing components (A), (B), and (C), component (A) being a silicone resin having a weight-average molecular weight of 3,000-500,000 and having constituent units represented by compositional formula (1),

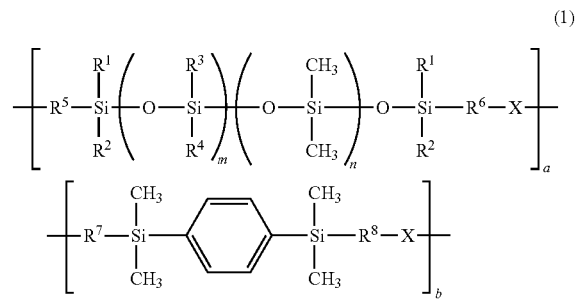

component (B) being an epoxy resin curing agent, and component (C) being a filler. The present invention is capable of providing a resin film and a resin composition whereby wafers can be molded (wafer molding) in batch fashion, the resin composition having good molding properties with respect to large-diameter thin-film wafers in particular while at the same time imparting low warpage after molding and good wafer-protective ability, the resin composition also facilitating the molding step and being suitable for use in wafer-level packaging.

10 Claims, No Drawings

(56) References Cited

FOREIGN PATENT DOCUMENTS

JP    2012-224062 A    11/2012
WO    WO 2009/142065 A1    11/2009

OTHER PUBLICATIONS

Written Opinion of the International Searching Authority for PCT/JP2015/050203 (PCT/ISA/237) dated Mar. 31, 2015.

* cited by examiner

RESIN COMPOSITION, RESIN FILM, AND SEMICONDUCTOR DEVICE AND METHOD FOR MANUFACTURING SAME

TECHNICAL FIELD

This invention relates to a resin composition, a resin film, and a semiconductor device and a method for manufacturing the same.

BACKGROUND ART

In the manufacture of microelectronic or semiconductor devices, a rapid progress is made toward wafers of larger diameter and reduced thickness. There is a need for the technique capable of encapsulating devices on the wafer level. While the technique for transfer molding solid epoxy resin compositions is conventional, a technique for compression molding liquid epoxy resin compositions is proposed (Patent Document 1: WO 2009/142065).

However, the transfer molding technique can cause wire deformation because the resin is flowed into narrow gaps. Short filling is more likely to occur as the encapsulation area becomes larger. The compression molding technique is difficult to precisely control the molding range at an end portion of the wafer. Also, it is not easy to optimize the flow and physical properties of the liquid encapsulating resin when it is fed into the molding machine. With the recent transition of wafers toward larger diameter and reduced thickness, the warpage of the wafer after encapsulation, which is not noticeable in the prior art, becomes a problem. Also better wafer protection is required. It would be desirable to have a wafer encapsulating or molding material which can encapsulate an overall wafer at a time without raising problems including short filling at the wafer surface, and which exhibits minimal warpage and satisfactory wafer protection after encapsulation.

SUMMARY OF THE INVENTION

Problems to be Solved by the Invention

An object of the invention, which has been made under the above circumstances, is to provide a resin composition and resin film, which can encapsulate an overall wafer at a time (i.e., wafer molding), is effectively encapsulatable over a large-diameter/thin wafer, offers minimal warpage and satisfactory wafer protection after encapsulation, ensures an efficient encapsulating process, and is thus suited for wafer-level packaging; a semiconductor device encapsulated with the resin film; and a method for manufacturing the semiconductor device.

Means for Solving the Problems

Intending to solve the above problems, the present invention provides a resin composition comprising the following components (A), (B), and (C), (A) a silicone resin comprising constituent units represented by the compositional formula (1):

[Chemical Formula 1]

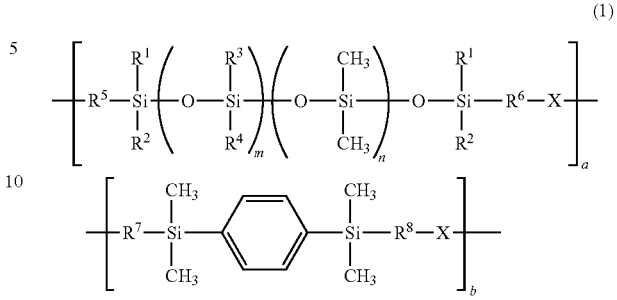

(1)

wherein $R^1$ to $R^4$ are each independently a monovalent hydrocarbon group of 1 to 8 carbon atoms, with the proviso that $R^3$ and $R^4$ are not methyl at the same time, m and n are each independently an integer of 0 to 300, each of $R^5$ to $R^8$ which may be the same or different is a divalent hydrocarbon group of 1 to 10 carbon atoms, a and b are positive numbers, satisfying a+b=1, X is a divalent organic group having the general formula (2):

[Chemical Formula 2]

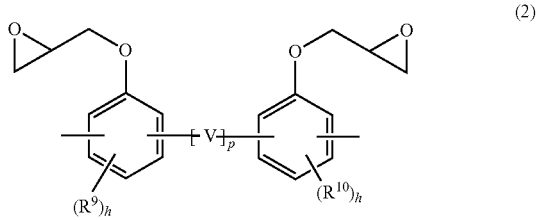

(2)

wherein V is a divalent organic group selected from the following:

[Chemical Formula 3]

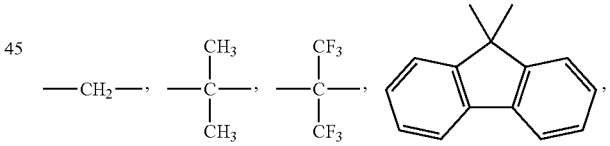

p is 0 or 1, each of $R^9$ and $R^{10}$ which may be the same or different is an alkyl or alkoxy group of 1 to 4 carbon atoms, and h is 0, 1 or 2, the silicone resin having a weight average molecular weight of 3,000 to 500,000, (B) an epoxy resin curing agent, and
(C) a filler.

Since the resin composition thus formulated can be formed into a film, a wafer may be encapsulated therewith in a batch (wafer molding). When applied to a wafer of large diameter and thin profile, the resin composition offers satisfactory encapsulating ability, adhesion, low warpage, wafer protection, and reliability. It is thus suited for wafer-level packaging.

Preferably, component (B) is present in an amount of 5 to 50 parts by weight per 100 parts by weight of component (A), and component (C) is present in a weight fraction of 30 to 90% by weight based on the total weight.

Since the resin composition thus formulated can be readily formed into a film, a wafer may be encapsulated therewith in a batch (wafer molding). When applied to a wafer of large diameter and thin profile, the resin composition offers more satisfactory encapsulating ability, adhesion, low warpage, wafer protection, and reliability. It is more suited for wafer-level packaging.

Also preferably, an epoxy resin cure accelerator is contained because adhesion to wafer and wafer protection are more improved. The resin composition is more suited for wafer-level packaging. When an epoxy resin is blended, the adhesion and protection are further improved.

The filler is preferably silica. Use of silica as the filler is convenient because wafer protection is further improved, heat resistance, moisture resistance, strength and the like are further improved, and reliability is enhanced.

The invention also provides a resin film formed using the resin composition.

The resin film in film form possesses satisfactory encapsulating ability relative to a wafer of large diameter and thin profile. When a wafer is encapsulated in a batch, it is unnecessary to cast a resin, eliminating such problems as short filling at the wafer surface. As long as the resin film is formed using the resin composition, it is a wafer encapsulating material that meets both adhesion to wafer and wafer protection at the same time.

In this embodiment, the resin film may be prepared, for example, by coating the resin composition onto a film serving as release or protective film to form a resin film precursor, providing at least two such resin film precursors, stripping the release or protective film from each resin film precursor, and joining the bare resin films to each other.

The invention further provides a method for manufacturing semiconductor devices, comprising the steps of attaching the resin film to a semiconductor wafer to encapsulate the wafer, and singulating the encapsulated wafer.

Since the semiconductor wafer encapsulated with the resin film experiences low warpage and is fully protected, semiconductor devices of quality may be manufactured in high yields by singulating the encapsulated semiconductor wafer.

Furthermore the invention provides a semiconductor device obtained by heat curing the resin film into a heat cured film, encapsulating a semiconductor wafer with the heat cured film, and singulating the encapsulated semiconductor wafer, the semiconductor device having the heat cured film.

The semiconductor wafer encapsulated with the heat cured film obtained by heat curing the resin film experiences minimal warpage while it is fully protected. By singulating the encapsulated wafer, semiconductor devices of quality may be manufactured without inducing warpage.

Advantageous Effects of the Invention

Since the resin composition of the invention can be processed into a film, it possesses satisfactory encapsulating or molding performance to large size/thin wafers. An overall wafer may be encapsulated with the resist film in a batch while the resin film ensures improved adhesion, low warpage and wafer protection. The resin film is thus useful in wafer-level packaging.

With the semiconductor device and the manufacturing method, semiconductor devices of quality are manufactured in high yields.

EMBODIMENT FOR CARRYING OUT THE INVENTION

As discussed above, it is recently desired to develop a wafer encapsulating or molding material which can encapsulate an overall wafer in a batch without raising problems including short filling at the wafer surface, and which exhibits minimal warpage and satisfactory wafer protection after encapsulation.

Making extensive investigations to attain the above object, the inventors have found that a resin composition having improved adhesion to wafer and minimal warpage after curing is obtainable by combining (A) a silicone resin with (B) an epoxy resin curing agent; that the resin composition is further improved in wafer protection and reliability after curing by adding (C) a filler thereto; and that a resin film obtained from the resin composition comprising these components is an effective wafer encapsulating material having both adhesion to wafer and wafer protection. The invention is predicated on this finding.

Below, the resin composition, resin film (composite film) obtained therefrom, semiconductor device and manufacture of semiconductor device according to the invention are described in detail although the invention is not limited thereto.

The resin composition of the invention comprises (A) a silicone resin, (B) an epoxy resin curing agent, and (C) a filler.

<Resin Composition>

[(A) Silicone Resin]

In the inventive composition, a silicone resin as component (A) has a function to provide a film forming ability.

When a resin film is used as a wafer encapsulating or molding material, the silicone resin imparts adhesion to wafer, minimal warpage and good encapsulating performance.

The silicone resin as component (A) is defined as comprising constituent units represented by the compositional formula (1) and having a weight average molecular weight of 3,000 to 500,000.

[Chemical Formula 4]

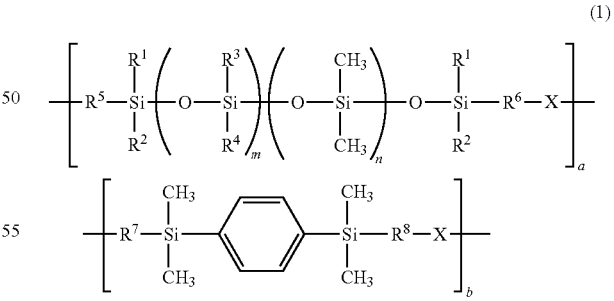

Herein $R^1$ to $R^4$ are each independently a monovalent hydrocarbon group of 1 to 8 carbon atoms, with the proviso that $R^3$ and $R^4$ are not methyl at the same time, m and n are each independently an integer of 0 to 300, each of $R^5$ to $R^8$ which may be the same or different is a divalent hydrocarbon group of 1 to 10 carbon atoms, a and b are positive numbers, satisfying a+b=1. X is a divalent organic group having the general formula (2):

[Chemical Formula 5]

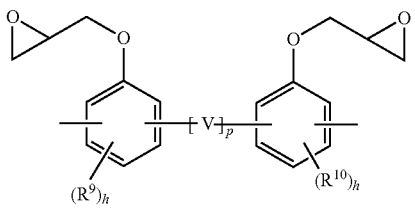

(2)

wherein V is a divalent organic group selected from the following:

[Chemical Formula 6]

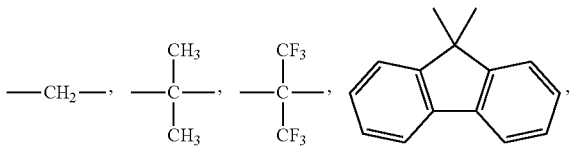

p is 0 or 1, each of $R^9$ and $R^{10}$ which may be the same or different is an alkyl or alkoxy group of 1 to 4 carbon atoms, and h is 0, 1 or 2.

The silicone resin is a polymer comprising recurring units represented by formula (1) and having a weight average molecular weight (Mw) of 3,000 to 500,000, preferably 5,000 to 200,000, as measured versus polystyrene standards by gel permeation chromatography (GPC) using tetrahydrofuran eluent. The subscripts a and b are positive numbers, satisfying a+b=1. The units may be arranged either randomly or as a block copolymer.

In formula (1), m and n are each independently an integer of 0 to 300, preferably m ranges from 0 to 200, especially from 0 to 100, and n ranges from 0 to 200, especially from 0 to 100. X is a divalent organic group having formula (2). $R^1$ to $R^4$ are each independently selected from monovalent hydrocarbon groups of 1 to 8 carbon atoms, preferably 1 to 6 carbon atoms. Suitable groups include alkyl, cycloalkyl and aryl groups, for example, such as methyl, ethyl, propyl, hexyl, cyclohexyl, and phenyl. Inter alia, methyl and phenyl are preferred because of availability of the starting reactant. It is noted that $R^3$ and $R^4$ are not methyl at the same time.

In formula (2), $R^9$ and $R^{10}$ are each independently selected from alkyl and alkoxy groups of 1 to 4 carbon atoms, preferably 1 to 2 carbon atoms, such as methyl, ethyl, propyl, tert-butyl, methoxy and ethoxy, and h is 0, 1 or 2, preferably 0.

In formula (2), V is a divalent group selected from the following groups, and p is 0 or 1.

[Chemical Formula 7]

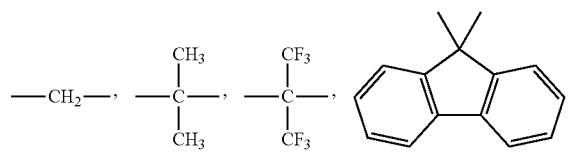

The subscripts a and b are positive numbers, satisfying a+b=1, preferably 0.05≤a≤0.80, especially 0.1≤a≤0.70, and 0.20≤b≤0.95, especially 0.30≤b≤0.90.

[Method for Preparing Silicone Resin (A)]

The silicone resin used herein may be prepared by selecting suitable compounds from the compounds having the general formulae (3), (4), (5) and (6), and subjecting them to addition polymerization in the presence of a metal catalyst.

[Chemical Formula 8]

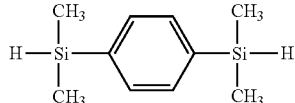

(3)

[Chemical Formula 9]

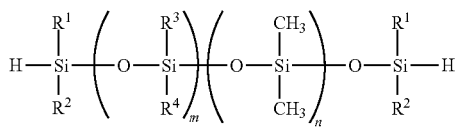

(4)

Herein $R^1$ to $R^4$ are each independently a monovalent hydrocarbon group of 1 to 8 carbon atoms, with the proviso that $R^1$ and $R^4$ are not methyl at the same time, m and n are each independently an integer of 0 to 300.

[Chemical Formula 10]

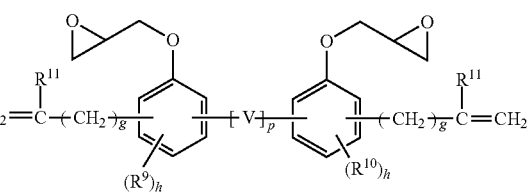

(5)

Herein V is a divalent organic group selected from the following:

[Chemical Formula 11]

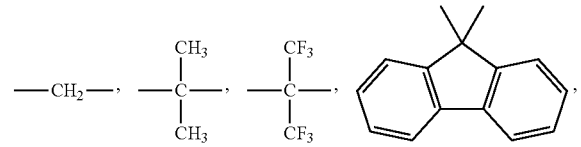

p is 0 or 1, each of $R^9$ and $R^{10}$ which may be the same or different is an alkyl or alkoxy group of 1 to 4 carbon atoms, and h is 0, 1 or 2. $R^{11}$ is hydrogen or methyl, and g is an integer of 0 to 7.

[Chemical Formula 12]

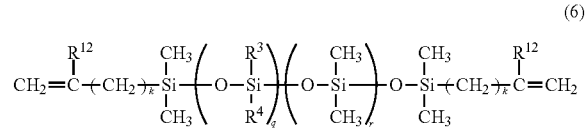

(6)

Herein $R^3$ and $R^4$ are each independently a monovalent hydrocarbon group of 1 to 8 carbon atoms, with the proviso that $R^3$ and $R^4$ are not methyl at the same time, q and r are each independently an integer of 0 to 300. $R^{12}$ is hydrogen or methyl, and k is an integer of 0 to 7.

As the metal catalyst which can be used herein, exemplary catalysts include elemental platinum group metals such as platinum (inclusive of platinum black), rhodium and palladium; platinum chloride, chloroplatinic acid and chloroplatinic acid salts such as $H_2PtCl_4 \cdot xH_2O$, $H_2PtCl_6 \cdot xH_2O$, $NaHPtCl_6 \cdot xH_2O$, $KHPtCl_6 \cdot xH_2O$, $Na_2PtCl_6 \cdot xH_2O$, $K_2PtCl_4 \cdot xH_2O$, $PtCl_4 \cdot xH_2O$, $PtCl_2$ and $Na_2HPtCl_4 \cdot xH_2O$ wherein x is an integer of 0 to 6, preferably 0 or 6; alcohol-modified chloroplatinic acid (see U.S. Pat. No. 3,220,972); complexes of chloroplatinic acid with olefins (see U.S. Pat. Nos. 3,159,601, 3,159,662 and 3,775,452); platinum group metals such as platinum black and palladium on carriers such as alumina, silica and carbon; rhodium-olefin complexes; chlorotris(triphenylphosphine)rhodium (known as Wilkinson catalyst); and complexes of platinum chloride, chloroplatinic acid or chloroplatinic acid salts with vinyl-containing siloxanes, especially vinyl-containing cyclic siloxanes.

The catalyst may be used in a catalytic amount, typically 0.0001 to 0.1%, preferably 0.001 to 0.01% by weight of platinum group metal based on the total weight of reactants. Although addition reaction may run even in a solventless system, a solvent may be used if desired. The solvent, if used, is preferably selected from hydrocarbon solvents such as toluene and xylene. The reaction temperature is arbitrary as long as the catalyst is not deactivated and polymerization is complete within a short time. For example, an appropriate temperature is 40 to 150° C., especially 60 to 120° C. The reaction time may be selected depending on the type and amount of reactants, and is preferably 0.5 to 100 hours, more preferably 0.5 to 30 hours. When the solvent is used, vacuum distillation is carried out at the end of reaction to distill off the solvent.

The reaction procedure is not particularly limited. When compounds of formulae (3), (4), (5), and (6) are reacted, one exemplary procedure is by premixing the compounds of formulae (5) and (6), heating the mixture, adding a metal catalyst to the mixture, and adding dropwise the compounds of formulae (3) and (4) over 0.1 to 5 hours.

Preferably the compounds of formulae (3), (4), (5), and (6) are blended such that the ratio of the total moles of hydrosilyl groups in the compounds of formulae (3) and (4) to the total moles of alkenyl groups in the compounds of formulae (5) and (6) may range from 0.67 to 1.67, more preferably from 0.83 to 1.25. The Mw of the polymer may be controlled by using a molecular weight modifier such as a monoallyl compound (e.g., o-allylphenol), monohydrosilane (e.g., triethylhydrosilane) or monohydrosiloxane.

[(B) Epoxy Resin Curing Agent]

Component (B) is to incur crosslinking reaction with the silicone resin (A) and effective for further improving the adhesion to wafer, protection and reliability of the silicone resin. The epoxy resin curing agent may be any of curing agents commonly used for the curing of epoxy resins. In view of heat resistance, it is preferably an aromatic curing agent or alicyclic curing agent though not limited thereto. Suitable epoxy resin curing agents include amine curing agents, acid anhydride curing agents, boron trifluoride amine complex salts, and phenolic resins. Exemplary of the amine curing agents are aliphatic amine curing agents such as diethylenetriamine, triethylenetetramine, and tetraethylenepentamine, alicyclic amine curing agents such as isophorone diamine, aromatic amine curing agents such as diaminodiphenylmethane and phenylenediamine, and dicyandiamide. Exemplary of the acid anhydride curing agents are phthalic anhydride, pyromellitic anhydride, trimellitic anhydride, and hexahydrophthalic anhydride. These epoxy resin curing agents may be used alone or in admixture.

Phenolic resins are also useful epoxy resin curing agents. Suitable phenolic resins include resole type phenolic resins and/or novolak type phenolic resins, which are prepared from such reactants as phenol, bisphenol A, alkylphenols such as p-tert-butylphenol, octylphenol, and p-cumylphenol, p-phenylphenol, and cresol. Thermosetting resins may be used alone or in admixture.

The amount of the epoxy resin curing agent used is preferably 5 to 50 parts, more preferably 5 to 40 parts by weight per 100 parts by weight of component (A), but not limited thereto. An amount of the curing agent within the range ensures that the resin composition is improved in adhesion and protection, and is preferable because the cured resin composition is more reliable.

In addition to the epoxy resin curing agent, the resin composition may contain an epoxy resin cure accelerator. The epoxy resin cure accelerator is effective for adequate and uniform progress of curing reaction. The amount of the epoxy resin cure accelerator used is preferably 0.1 to 10 parts, more preferably 0.2 to 5 parts by weight per 100 parts by weight of component (A).

Examples of the epoxy resin cure accelerator include imidazole compounds such as 2-methylimidazole, 2-ethylimidazole, 2-ethyl-4-methylimidazole, ethylisocyanates of the foregoing, 2-phenylimidazole, 2-phenyl-4-methylimidazole, 2-phenyl-4-methyl-5-hydroxymethylimidazole, and 2-phenyl-4,5-dihydroxymethylimidazole; DBU compounds such as 1,8-diazabicyclo(5.4.0)undecane-7 (DBU), 1,5-diazabicyclo(4.3.0)nonene-5 (DBN), organic acid salts of DBU, phenolic resin salts of DBU, and tetraphenylborate salts of DBU derivatives; triorganophosphines such as triphenylphosphine, tributylphosphine, tris(p-methylphenyl)phosphine, tris(p-methoxyphenyl)phosphine, tris(p-ethoxyphenyl)phosphine, triphenylphosphine-triphenylborate, and tetraphenylphosphine-tetraphenylborate; quaternary phosphonium salts, tertiary amines such as triethyleneammonium-triphenylborate, and tetraphenylboric acid salts thereof. The epoxy resin cure accelerators may be used alone or in admixture.

[(C) Filler]

Component (C) is a filler for imparting wafer protection to the resin composition, improving its heat resistance, moisture resistance and strength, and enhancing its reliability. Suitable fillers include silicic acid salts such as talc, calcined clay, non-calcined clay, mica and glass; oxides such as titanium oxide, alumina, fused silica (e.g., fused spherical silica and fused ground silica), and crystalline silica powder; carbonates such as calcium carbonate, magnesium carbonate and hydrotalcite; hydroxides such as aluminum hydroxide, magnesium hydroxide, and calcium hydroxide; sulfates and sulfites such as barium sulfate, calcium sulfate, calcium sulfite; boric acid salts such as zinc borate, barium metaborate, aluminum borate, calcium borate, and sodium borate; and nitrides such as aluminum nitride, boron nitride, and silicon nitride. The fillers may be used alone or in admixture. Inter alia, powdered silica such as fused silica or crystalline silica is preferred. Examples of the powdered silica include reinforcing silica such as fumed silica or precipitated silica, and crystalline silica such as quartz. Illustrative examples of silica include Aerosil R972, R974, and R976 from Nippon Aerosil Co., Ltd., SE-2050, SC-2050, SE-1050, SO-E1, SO-C1, SO-E2, SO-C2, SO-E3, SO-C3, SO-E5, and SO-C5 from Admatechs, and Musil 120A and Musil 130A from Shin-Etsu Chemical Co., Ltd.

The filler preferably has an average particle size of 0.01 to 20 μm, more preferably 0.01 to 10 μm, although the particle size is not limited thereto. An inorganic filler with an average particle size beyond the lower limit is unlikely to agglomerate and effective to impart strength. An inorganic filler with an average particle size below the upper limit allows the resin to flow between chips and achieves dense filling. The average particle size is measured by a particle size distribution measuring instrument based on the laser diffraction method, as a weight average value, that is, weight basis 50% cumulative particle diameter ($D_{50}$) or median diameter.

The filler is preferably used in an amount of 30 to 90% by weight, more preferably 50 to 85% by weight based on the total weight of the resin composition. An amount of the filler below the upper limit ensures a film forming ability, smooth resin flow and dense filling. An amount of the filler above the lower limit is fully effective.

Epoxy Resin

To the resin composition, an epoxy resin may be added for the purpose of improving adhesion to wafer and protection. Like the silicone resin (A), the epoxy resin undergoes crosslinking reaction with the epoxy resin curing agent (B) for thereby improving adhesion to wafer, protection, and reliability.

Examples of the epoxy resin include bisphenol A epoxy resins, bisphenol F epoxy resins, hydrogenated products thereof, glycidyl ether based epoxy resins such as phenol novolak type epoxy resins and cresol novolak type epoxy resins, glycidyl ester based epoxy resins such as glycidyl hexahydrophthalate and dimer acid glycidyl esters, triglycidyl isocyanurate, and glycidyl amine based epoxy resins such as tetraglycidyl diaminodiphenylmethane. Inter alfa, bisphenol A epoxy resins, bisphenol F epoxy resins, phenol novolak type epoxy resins, and cresol novolak type epoxy resins are preferred. These resins are commercially available, for example, under the trade name of jER 1001 and jER 517 from Mitsubishi Chemical Co., Ltd., Epiclon 830S from DIC Corp., and EOCN 1035 from Nippon Kayaku Co., Ltd.

The epoxy resin is preferably added in an amount of 1 to 50 parts, more preferably 2 to 30 parts by weight per 100 parts by weight of component (A).

Silane Coupling Agent

The resin composition may further comprise a silane coupling agent, which is effective for further improving the adhesion of the resin composition to a substrate. Suitable silane coupling agents include epoxy silane coupling agents and aromatic amino silane coupling agents, which may be used alone or in admixture. An amount of the silane coupling agent is preferably 0.01 to 5% by weight based on the total weight of the resin composition, but not limited thereto.

Another component may be added to the resin composition. For example, additives may be added for improving the compatibility between silicone resin (A) and epoxy resin curing agent (B), or enhancing the storage stability, workability and other properties of the resin composition. Suitable additives include internal parting agents such as fatty acid esters, glycerates, zinc stearate, and calcium stearate, and antioxidants such as phenol, phosphorus or sulfur-based antioxidants. Although the other optional components may be added to the resin composition on a solventless basis, they may be dissolved or dispersed in an organic solvent to form a solution or dispersion before they are added to the resin composition. As the solvent for preparing a dispersion of the resin composition, any of the following organic solvents may be used.

Organic Solvent

Although the other optional components may be added to the adhesive composition on a solventless basis, they may be dissolved or dispersed in an organic solvent to form a solution or dispersion (simply referred to as "solution," hereinafter) before they are added to the resin composition. Suitable organic solvents include N,N-dimethylacetamide, methyl ethyl ketone, N,N-dimethylformamide, cyclohexanone, cyclopentanone, N-methyl-2-pyrrolidone, toluene, methanol, ethanol, isopropanol, acetone, propylene glycol monomethyl ether, and propylene glycol monomethyl ether acetate (PGMEA). Inter alia, methyl ethyl ketone, cyclopentanone, propylene glycol monomethyl ether, and PGMEA are preferred. The organic solvents may be used alone or in admixture.

<Resin Film>

Preferably the resin composition is preformed into a film. The resin film has good encapsulating ability to large-diameter/thin wafers, and eliminates a need to cast the resin composition when a wafer is encapsulated in a batch. This essentially solves the outstanding problems in the prior art including wire deformation and short filling at wafer surface in the case of transfer molding, difficult control of the molding range in the case of compression molding, and fluidity and physical properties of liquid encapsulant resins.

The thickness of the resin film is preferably at least 50 μm and up to 1,000 μm, more preferably 80 μm to 700 μm, but not limited thereto. A resin film with a thickness in the range has the advantages of minimal warpage and good protection.

In this sense, the invention provides a resin film formed from the resin composition. Embodiments of the resin film include a resin film formed from the resin composition, and a protected resin film consisting of a resin film and a protective layer covering the resin film. The protective layer will be described later. One exemplary method for preparing the resin film is described below.

(Preparation of Resin Film)

First, a resin composition in liquid form, i.e., resin composition solution is prepared by mixing silicone resin (A), epoxy resin curing agent (B), filler (C), and optional components in an organic solvent. Using a reverse roll coater, comma coater or the like, the resin composition solution is coated onto a protective layer (protective film or release film). The protective layer coated with the resin composition solution is passed through an in-line dryer where it is dried at 80 to 160° C. for 2 to 20 minutes to remove the organic solvent. Using a roll laminator, the coated protective layer is pressure bonded to another protective layer for lamination, yielding a resin film according to the invention.

The preferred pressure bonding conditions include a temperature of 50 to 100° C., a linear pressure of 0.5 to 5 kgf/cm, and a speed of 0.1 to 5 m/min, but are not limited thereto.

In another embodiment, at least two such resin film precursors are furnished, the protective layer is stripped from each precursor to bare the resin layer, the bare resin layers are joined to each other, yielding a composite resin film consisting of multiple resin layers. In the joining step, preferably the resin layers are bonded while heating at 30 to 120° C.

Protective Layer (Protective or Release Film)

The protective layer used herein is not particularly limited as long as it can be stripped from the film precursor without adversely affecting the shape of the resin film. The protective layer serves as a protective film or release film for wafers. Included are plastic films such as polyethylene (PE) film, polypropylene (PP) film, polymethylpentene (TPX) film, and polyester film treated with a parting agent. Typically the protective layer requires a release force of 50 to 300 mN/min and has a thickness of 25 to 100 μm, preferably 38 to 75 μm.

(Wafer to be Encapsulated)

The wafer to be encapsulated with the resin film in a batch is not particularly limited, and it may be a wafer having semiconductor devices or chips mounted thereon or a semiconductor wafer having semiconductor devices built in its surface. The resin film has a good filling ability relative to the wafer surface prior to encapsulating and offers minimal warpage and good protection after encapsulation to the wafer. The resin film is advantageously applicable to large-diameter wafers having a diameter of at least 8 inches, typically 8 inches (200 mm) or 12 inches (300 mm), and thin wafers, although the wafer is not limited thereto.

As the thin wafer, a wafer which has been thinned to a thickness of 5 to 300 μm is preferably used.

(Encapsulation of Wafer)

The method for encapsulating or molding a wafer with the resin film of the invention is not particularly limited. For example, one protective layer on the resin film is stripped. Using a vacuum laminator (e.g., model TEAM-100RF by Takatori Corp.) whose vacuum chamber is set at a vacuum of 50 to 1,000 Pa, preferably 50 to 500 Pa, typically 100 Pa, and a temperature of 80 to 200° C., preferably 80 to 130° C., typically 100° C., the resin film on the other protective layer is attached to a wafer in a batch. After restoration of atmospheric pressure, the wafer is cooled to room temperature and taken out of the laminator, and the other protective layer is stripped off. Thereafter, the resin film on the wafer may be heat cured at 120 to 220° C. for 15 to 180 minutes.

<Semiconductor Device>

The semiconductor wafer encapsulated with the resin film which is obtained by heat curing the resin film is then diced (singulation) into discrete semiconductor devices each having the heat cured film. Specifically, the resin film-encapsulated or molded wafer is attached to a semiconductor processing protective tape (such as dicing tape), with the resin film or wafer side in contact with the tape, and rested on a chuck table of a dicer, before it is diced by means of a dicing saw with a dicing blade (e.g., DFD6361 by DISCO Corp.). Although the spindle revolution and cutting speed of dicing operation may vary over a wide range, appropriate dicing conditions include a spindle revolution of 25,000 to 45,000 rpm and a cutting speed of 10 to 50 mm/sec. Discrete units are generally dimensioned from 2 mm×2 mm to 30 mm×30 mm, although the dimensions depend on a particular semiconductor package design.

Now that the wafer which is minimized in warpage and fully protected with the resin film is singulated using a dicing blade, for example, discrete semiconductor devices of quality are obtained in high yields.

<Manufacture of Semiconductor Device>

The invention also provides a method for manufacturing semiconductor devices, comprising the steps of stripping one protective layer from the laminate of resin film sandwiched between protective layers, attaching the bare resin film to a semiconductor wafer, and stripping the other protective layer from the resin film, for thereby encapsulating the semiconductor wafer with the resin film, and singulating the encapsulated semiconductor wafer into discrete devices.

EXAMPLES

Synthesis Examples, Examples and Comparative Examples are given below by way of illustration and not by way of limitation.

Synthesis Examples 1 to 3

In Synthesis Examples, the weight average molecular weight (Mw) of a polymer was measured by gel permeation chromatography (GPC) versus monodisperse polystyrene standards, using GPC column TSKgel Super HZM-H (Tosoh Corp.) under conditions including tetrahydrofuran eluent, flow rate 0.6 mL/min and column temperature 40° C.

The compounds used in Examples and Comparative Examples are identified below.

[Chemical Formula 13]

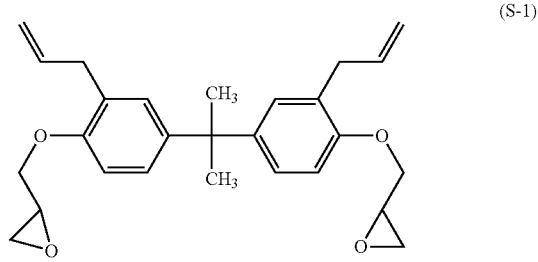

(S-1)

(S-2, Shin-Etsu Chemical Co., Ltd.)

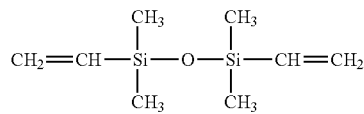

(S-3, Shin-Etsu Chemical Co., Ltd.)

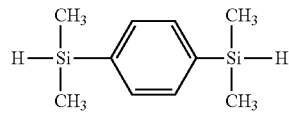

(S-4, Shin-Etsu Chemical Co., Ltd.)

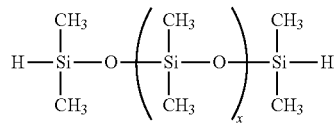

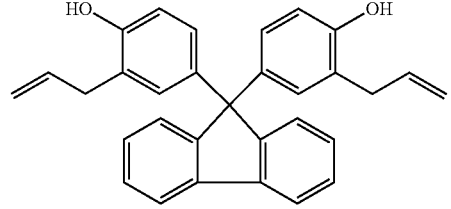

(S-5)

Synthesis Example 1

A 3-L flask equipped with a stirrer, thermometer, nitrogen purging line and reflux condenser was charged with 147 g (0.35 mol) of Compound S-1 and 27.9 g (0.15 mol) of Compound S-2, to which 2,000 g of toluene was added. The flask was heated at 70° C., after which 1.0 g of a toluene solution of chloroplatinic acid (Pt concentration 0.5 wt %)

was admitted, and 77.8 g (0.4 mol) of Compound S-3 and 309.4 g (0.1 mol) of Compound S-4 wherein x=40 were added dropwise over 1 hour. This resulted in a ratio of (total moles of hydrosilyl groups)/(total moles of alkenyl groups) =1/1. At the end of dropwise addition, the reaction solution was heated at 100° C. and ripened for 6 hours. Toluene was distilled off in vacuum from the reaction solution, yielding a product having a Mw of 45,000 as measured by GPC versus polystyrene standards. The resin product, designated Resin #1, was used in Examples and Comparative Examples.

Synthesis Example 2

A 3-L flask equipped with a stirrer, thermometer, nitrogen purging line and reflux condenser was charged with 210 g (0.50 mol) of Compound S-1, to which 2,100 g of toluene was added. The flask was heated at 70° C., after which 1.0 g of a toluene solution of chloroplatinic acid (Pt concentration 0.5 wt %) was admitted, and 77.8 g (0.4 mol) of Compound S-3 and 753.4 g (0.1 mol) of Compound S-4 wherein x=100 were added dropwise over 2 hours. This resulted in a ratio of (total moles of hydrosilyl groups)/(total moles of alkenyl groups) =1/1. At the end of dropwise addition, the reaction solution was heated at 100° C. and ripened for 6 hours. Toluene was distilled off in vacuum from the reaction solution, yielding a product having a Mw of 48,000 as measured by GPC versus polystyrene standards. The resin product, designated Resin #2, was used in Examples.

Synthesis Example 3

A 3-L flask equipped with a stirrer, thermometer, nitrogen purging line and reflux condenser was charged with 105 g (0.25 mol) of Compound S-1 and 46.5 g (0.25 mol) of Compound S-2, to which 1,000 g of toluene was added. The flask was heated at 70° C., after which 0.5 g of a toluene solution of chloroplatinic acid (Pt concentration 0.5 wt %) was admitted, and 48.6 g (0.25 mol) of Compound S-3 and 181.5 g (0.25 mol) of Compound S-4 wherein x=8 were added dropwise over 1 hour. This resulted in a ratio of (total moles of hydrosilyl groups)/(total moles of alkenyl groups) =1/1. At the end of dropwise addition, the reaction solution was heated at 100° C. and ripened for 6 hours. Toluene was distilled off in vacuum from the reaction solution, yielding a product having a Mw of 32,000 as measured by GPC versus polystyrene standards. The resin product, designated Resin #3, was used in Examples.

Comparative Synthesis Example 1

A 3-L flask equipped with a stirrer, thermometer, nitrogen purging line and reflux condenser was charged with 151 g (0.35 mol) of Compound S-5 and 27.9 g (0.15 mol) of Compound S-2, to which 2,000 g of toluene was added. The flask was heated at 70° C., after which 1.0 g of a toluene solution of chloroplatinic acid (Pt concentration 0.5 wt %) was admitted, and 77.8 g (0.4 mol) of Compound S-3 and 309.4 g (0.1 mol) of Compound S-4 wherein x=40 were added dropwise over 1 hour. This resulted in a ratio of (total moles of hydrosilyl groups)/(total moles of alkenyl groups) =1/1. At the end of dropwise addition, the reaction solution was heated at 100° C. and ripened for 6 hours. Toluene was distilled off in vacuum from the reaction solution, yielding a product having a Mw of 38,000 as measured by GPC versus polystyrene standards. The product, designated Resin #4, was used in Comparative Examples.

Comparative Synthesis Example 2

In a 5-L flask equipped with a stirrer, thermometer, nitrogen purging line and reflux condenser, 396.5 g (0.92 mol) of Compound S-1 was dissolved in 1,668 g of toluene. Then 859.2 g (0.28 mol) of Compound S-4 wherein x=40 was added to the solution, which was heated at 60° C. Thereafter, 2.2 g of a platinum-on-carbon catalyst (5 wt %) was admitted. It was confirmed that the internal reaction temperature rose to 65-67° C., after which the solution was heated at 90° C. for 3 hours. The solution was cooled to 60° C. again, whereupon 2.2 g of a platinum-on-carbon catalyst (5 wt %) was admitted, and 78.3 g (0.54 mol) of Compound S-4 wherein x=0 was added dropwise to the flask over 1 hour. This resulted in a ratio of (total moles of hydrosilyl groups)/(total moles of alkenyl groups)=1/1.12. At the end of dropwise addition, the reaction solution was heated at 100° C. and ripened for 6 hours. Toluene was distilled off in vacuum from the reaction solution, yielding a product having a Mw of 42,000 as measured by GPC versus polystyrene standards. The product, designated Resin #5, was used in Comparative Examples.

Examples 1 to 6 & Comparative Examples 1 to 3

<Preparation of Resin Composition>

A resin composition in liquid dispersion form was prepared by mixing silicone resin (A) (Resin #1, #2 or #3 in Synthesis Examples 1 to 3), epoxy resin curing agent (B), epoxy resin cure accelerator, filler (C), and optional components in accordance with the formulation shown in Table 1, adding cyclopentanone to the mixture so as to give a solids concentration of 65 wt %, agitating and milling the mixture in a ball mill for dissolution and dispersion. Notably, the amount of components in Table 1 is expressed in "parts by weight." Comparative Example 1 is a resin composition not containing epoxy resin curing agent (B); Comparative Example 2 is a resin composition not containing filler (C); Comparative Example 3 is a resin composition containing a silicone resin different from silicone resin (A) according to the invention, specifically Resin #4.

The components used in the preparation of resin compositions are identified below.

Epox Resin Curing Agent (B)
  Rikacid HH (trade name, New Japan Chemical Co., Ltd., hexahydrophthalic anhydride, molecular weight 154)
  Phenolite TD-2093 (DIC Corp., phenol novolak resin, OH equivalent 98-102)

Also, an epoxy resin cure accelerator as shown below is was used.

Epoxy Resin Cure Accelerator
  Curesol 2P4MHZ (trade name, Shikoku Chemicals Corp., 2-phenyl-4-methyl-5-hydroxymethyl-imidazole)
  Curesol 2PHZ (trade name, Shikoku Chemicals Corp., 2-phenyl-4,5-dihydroxymethylimidazole)

Filler (C)
  Silica (Admatechs, average particle size 5.0 μm)

Other Components
  EOCN-1035 (trade name, Nippon Kayaku Co., Ltd., epoxy resin, epoxy equivalent 209-219)
  RE-310S (trade name, Nippon Kayaku Co., Ltd., liquid epoxy resin, epoxy equivalent 190)

Notably, the epoxy equivalent refers to the equivalent amount of epoxy groups per molecule.

Release film #1: E7304 (Toyobo Co., Ltd., polyester, thickness 75 μm, release force 200 mN/50 mm)
Release film #2: E7302 (Toyobo Co., Ltd., polyester, thickness 75 μm, release force 90 mN/50 mm)
Protective film: polyethylene film of 100 μm thick

TABLE 1

| Component (pbw) | | Example 1 | Example 2 | Example 3 | Example 4 | Example 5 | Example 6 | Comparative Example 1 | Comparative Example 2 | Comparative Example 3 | Comparative Example 4 | |
|---|---|---|---|---|---|---|---|---|---|---|---|---|
| (A) Silicone resin | Synthesis Example 1 | 100 | 100 | 100 | | | 100 | 100 | 100 | | | |
| | Synthesis Example 2 | | | | 100 | | | | | | | |
| | Synthesis Example 3 | | | | | 100 | | | | | | |
| Silicone resin outside the invention | Comparative Synthesis Example 1 | | | | | | | | | 100 | | |
| | Comparative Synthesis Example 2 | | | | | | | | | | 100 | 100 |
| (B) Epoxy resin curing agent | Rikacid HH | 10 | 10 | 10 | | | 10 | | 10 | | | |
| | Phenolite TD-2093 | | | | 11 | 30 | | | | | | |
| | Curesol 2P4MHZ | 1 | 1 | 1 | 1 | 1 | 1 | | 1 | 1 | | |
| | Curesol 2PHZ | | | | | | | | | | 1.1 | 0.14 |
| (C) Filler | silica | 125 | 500 | 400 | 500 | 400 | 500 | 125 | | 125 | 1000 | 28.2 |
| Other component | EOCN-103S | | | | | 35 | | | | 6 | | |
| | RE-310S | | | | | | | | | | 11.1 | 12.7 |
| Resin film thickness (μm) | | 200 | 200 | 200 | 200 | 200 | 500 | 200 | 200 | 200 | 100 | 400 |

Example 1

(Formation of Resin Film)

Using a die coater as film coater, the resin composition of Example 1 in Table 1 was coated onto a release film which was Release film #1 of E7304. This was passed through a hot-air circulating oven of 4 m long set at 100° C., forming a resin layer of 100 μm thick on Release film #1.

Using a roll laminator, a protective film which was a polyethylene film of 100 μm thick was joined and bonded to the resin layer under a linear pressure of 10 N/cm, yielding a first laminate of Release film #1/resin layer/protective film.

The above procedure was repeated aside from using Release film #2 of E7302 instead of Release film #1. There was obtained a second laminate of Release film #2/resin layer/protective film.

Next, the protective films (PE films) were stripped from the first and second laminates. The bare resin layers were mated together and passed through a hot roll laminator at 60° C. to form an integral laminate consisting of Release film #1/resin film/Release film #2 wherein the resin film had a thickness of 200 μm.

Examples 2 to 6 & Comparative Examples 1 to 3

Integral laminates having a resin film of 200 μm thick were prepared by following the same procedure as in Example 1 and using the resin compositions in Table 1.

It is noted that Example 6 used the same resin composition as Example 2 and formed a resin film having a thickness of 500 μm.

Comparative Example 4

Two resin layers having different compositions as shown in Table 1 were formed by the same procedure as in Example 1. One resin layer with a high filler content (left column of Comparative Example 4 in Table 1) had a thickness of 100 μm whereas the other resin layer with a low filler content (right column of Comparative Example 4 in Table 1) had a thickness of 400 μm. The two resin layers were joined into a single resin film.

[Encapsulation of Wafer with Resin Film]

There were furnished silicon wafers having a diameter of 12 inches (300 mm) and a thickness of 100 μm. Release film #2 was stripped from each of the integral laminates of Examples 1 to 6 and Comparative Examples 1 to 4. Using a vacuum laminator model TEAM-300M (Takatori Corp.) with a vacuum chamber set at a vacuum of 250 Pa, the bare resin film was attached to the silicon wafer in a batch at a temperature of 110° C. After restoration of atmospheric pressure, the silicon wafer was cooled to 25° C. and taken out of the laminator. Release film #1 was stripped off.

It is noted that in Comparative Example 4, the lower filler content resin layer of the resin film was bonded to the wafer surface.

There was left the resin film-encapsulated wafer, which was heated in an inert oven at 180° C. for 2 hours for curing the resin.

[Test 1: Wafer Warpage]

The wafer after curing of the resin film was measured for warpage by a laser instrument FLX-3300-T (Toho Technology Co., Ltd.). The results are shown in Table 2.

[Test 2: Wafer Supportability]

While the wafer was supported at an edge, the wafer was measured for deflection. Wafer supportability is rated good when the deflection is within 20 mm and poor when the deflection exceeds 20 mm. The results are shown in Table 2.

[Test 3: Adhesion]

Using a vacuum laminator model TEAM-100 (Takatori Corp.) with a vacuum chamber set at a vacuum of 100 Pa and a temperature of 100° C., a resin film of 25 μm thick was attached and bonded to a semiconductor wafer having a diameter of 6 inches and a thickness of 625 um (Shin-Etsu Chemical Co., Ltd.). Using a dicing saw with a dicing blade (DAD685 by DISCO Corp.), the wafer was diced into square pieces of 2 mm×2 mm. There was separately furnished a silicon wafer (base substrate) of 15 mm×15 mm. A square chip of 2 mm×2 mm with its resin film faced down was placed on the silicon wafer and bonded thereto at 150° C. under a load of 50 mN. The assembly was heated at 180° C. for 2 hours to cure the resin film. In this way, five test samples were prepared for each Example and subjected to the following bond strength test.

It is noted that in Comparative Example 4, the low filler content resin layer had a thickness of 40 μm, the high filler content resin layer had a thickness of 10 μm, and the low filler content resin layer was bonded to a semiconductor wafer having a diameter of 6 inches and a thickness of 625 μm (Shin-Etsu Chemical Co., Ltd.).

A bond tester (Dage series 4000-PXY by Dage) was used. In an attempt to peel the semiconductor chip (2 mm×2 mm) from the base substrate (square silicon wafer of 15 mm×15 mm), a resisting force was measured and reported as the adhesion or bond strength of the resin film. The test conditions included a speed of 200 μm/sec and a height of 50 μm. The results are shown in Table 2. The value in Table 2 is an average of measurements of five test samples, and a higher value indicates a higher bond strength of the bonding sheet.

[Test 4: Reliability]

By operating a dicing saw with a dicing blade (DAD685 by DISCO Corp.) at a spindle revolution of 40,000 rpm and a cutting speed of 20 mm/sec, the wafer encapsulated with the cured resin film was diced into square test samples of 10 mm×10 mm. Ten test samples (for each Example) were subjected to a thermal cycling test of repeating 1,000 cycles of holding at −25° C. for 10 minutes and holding at 125° C. for 10 minutes. After the thermal cycling test, it was inspected whether or not the resin film peeled from the wafer. The judgment is good when peel is observed in none of the samples, and poor when peel is observed in one or more samples. The results are shown in Table 2.

TABLE 2

| Test item | Example | | | | | | Comparative Example | | | |
|---|---|---|---|---|---|---|---|---|---|---|
| | 1 | 2 | 3 | 4 | 5 | 6 | 1 | 2 | 3 | 4 |
| Wafer warpage (mm) | ≤1 | ≤1 | ≤1 | ≤1 | ≤1 | ≤1 | ≤1 | ≤1 | 25 | 5 |
| Wafer supportability | good | good | good | good | good | good | good | poor | good | good |
| Adhesion (MPa) | 28.5 | 31.5 | 29.8 | 29.4 | 28.5 | 31.5 | 10.5 | 24.2 | 25.8 | 23.4 |
| Reliability | good | good | good | good | good | good | poor | poor | poor | poor |

It is evident from the test data that all the resin films of the resin compositions within the invention offer reduced wafer warpage, good wafer supportability, adhesion and reliability as compared with Comparative Examples.

The resin composition of the invention is formed into a film, with which a wafer can be encapsulated or molded in a batch. The resin film of the resin composition has satisfactory encapsulating performance to large-diameter/thin wafers. The resin film made of the resin composition of the invention has the advantages of minimal warpage, wafer protection, adhesion and reliability.

The invention is not limited to the above-illustrated embodiments. Although particular embodiments have been described for purposes of illustration, any embodiments having substantially the same construction as the technical idea described in the claims and achieving substantially the same function and results fall within the spirit and scope of the invention.

The invention claimed is:

1. A resin composition comprising the following components (A), (B), and (C), (A) 100 parts by weight of a silicone resin comprising constituent units represented by the compositional formula (1):

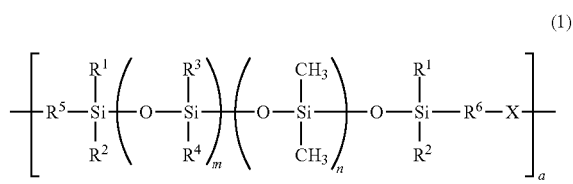

(1)

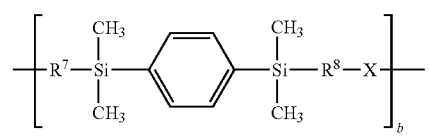

wherein $R^1$ to $R^4$ are each independently a monovalent hydrocarbon group of 1 to 8 carbon atoms, with the proviso that $R^3$ and $R^4$ are not methyl at the same time, m and n are each independently an integer of 0 to 300, each of $R^5$ to $R^8$ which may be the same or different is a divalent hydrocarbon group of 1 to 10 carbon atoms, a and b are positive numbers, satisfying a+b =1, and X is a divalent organic group having the general formula (2):

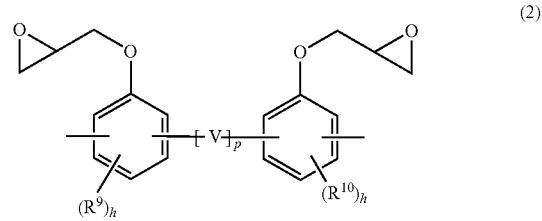

(2)

wherein V is a divalent organic group selected from the following:

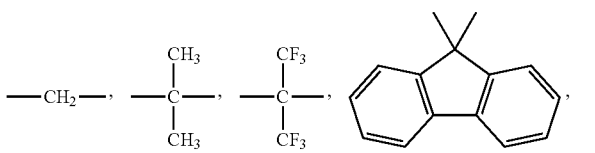

p is 0 or 1, each of $R^9$ and $R^{10}$ which may be the same or different is an alkyl or alkoxy group of 1 to 4 carbon atoms, and h is 0, 1 or 2,
the silicone resin having a weight average molecular weight of 3,000 to 500,000,
  (B) 5 to 50 parts by weight of an epoxy resin curing agent, and
  (C) 400 to 500 parts by weight of a filler.

2. The resin composition of claim 1 wherein component (B) is an amine, phenol or acid anhydride base curing agent.

3. The resin composition of claim 1, further comprising an epoxy resin cure accelerator.

4. The resin composition of claim 1, further comprising an epoxy resin.

5. The resin composition of claim 1 wherein said filler is silica.

6. A resin film obtained by forming the resin composition of claim 1 into a film.

7. A method for preparing a resin film, comprising the steps of coating the resin composition of claim 1 onto a film serving as release or protective film to form a resin film precursor, providing at least two such precursors, stripping the release or protective film from each precursor, and joining the bare resin films to each other.

8. A method for manufacturing semiconductor devices, comprising the steps of attaching the resin film of claim 6 to a semiconductor wafer to encapsulate the wafer, and singulating the encapsulated wafer.

9. A semiconductor device obtained from singulation of a semiconductor wafer which is encapsulated with a heat cured film which has been prepared by heat curing a resin film obtained by forming a resin composition comprising the following components (A), (B), and (C) into a film: (A) 100 parts by weight of a silicone resin having a weight average molecular weight of 3,000 to 500,000 and comprising constituent units represented by the compositional formula (1):

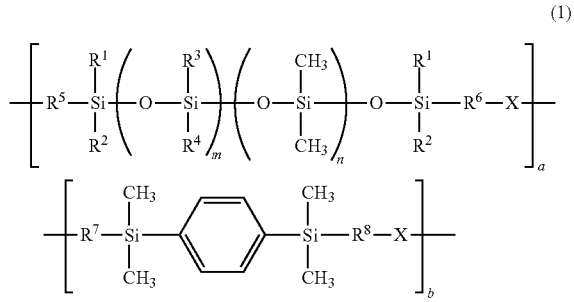

wherein $R^1$ to $R^4$ are each independently a monovalent hydrocarbon group of 1 to 8 carbon atoms, with the proviso that $R^3$ and $R^4$ are not methyl at the same time, m and n are each independently an integer of 0 to 300, each of $R^5$ to $R^8$ which may be the same or different is a divalent hydrocarbon group of 1 to 10 carbon atoms, a and b are positive numbers, satisfying a+b =1, and X is a divalent organic group having the general formula (2):

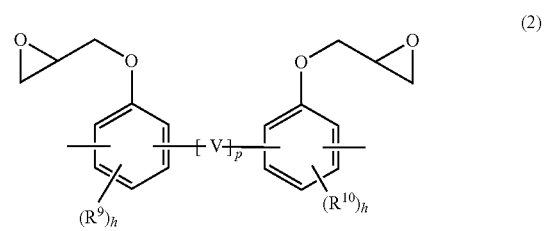

wherein V is a divalent organic group selected from the following:

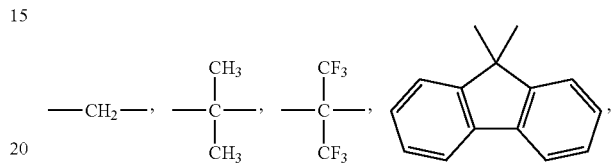

p is 0 or 1, each of $R^9$ and $R^{10}$ which may be the same or different is an alkyl or alkoxy group of 1 to 4 carbon atoms, and h is 0, 1 or 2; (B) 5 to 50 parts by weight of an epoxy resin curing agent; and (C) 400 to 500 parts by weight of a filler, the semiconductor device having the heat cured film.

10. The resin composition of claim 1, wherein silicone resin (A) consists of constituent units represented by the compositional formula (1):

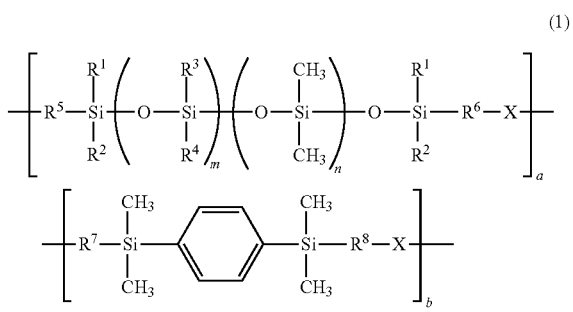

wherein
  $R^1$ to $R^4$ are each independently a monovalent hydrocarbon group of 1 to 8 carbon atoms, with the proviso that $R^3$ and $R^4$ are not methyl at the same time,
  m and n are each independently an integer of 0 to 300,
  each of $R^5$ to $R^8$ which may be the same or different is a divalent hydrocarbon group of 1 to 10 carbon atoms,
  a and b are positive numbers, satisfying a+b =1, and
  X is a divalent organic group having the general formula (2):

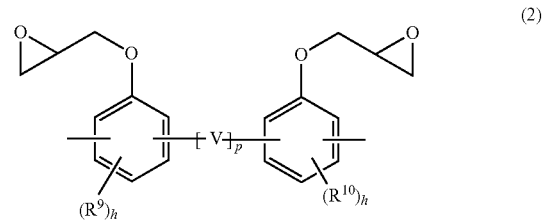

wherein V is a divalent organic group selected from the following:

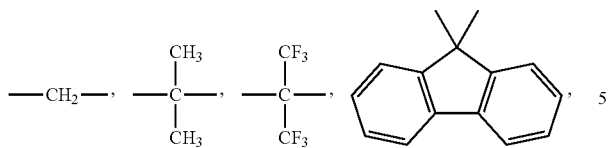
p is 0 or 1, each of $R^9$ and $R^{10}$ which may be the same or different is an alkyl or alkoxy group of 1 to 4 carbon atoms, and h is 0, 1 or 2.
* * * * *